United States Patent
Chanclou et al.

(10) Patent No.: US 6,937,792 B2
(45) Date of Patent: Aug. 30, 2005

(54) METHOD AND APPARATUS FOR WAVELENGTH SWITCHING OF A LASER SOURCE

(75) Inventors: Philippe Chanclou, Lannion (FR); Monique Thual, Trebeurden (FR); Michel Gadonna, Lannion (FR); Arnaud Laurent, Tregastel (FR)

(73) Assignee: France Telecom, Paris (FR)

( * ) Notice: Subject to any disclaimer, the term of this patent is extended or adjusted under 35 U.S.C. 154(b) by 32 days.

(21) Appl. No.: 10/182,003

(22) PCT Filed: Jan. 19, 2001

(86) PCT No.: PCT/FR01/00196

§ 371 (c)(1),
(2), (4) Date: Oct. 4, 2002

(87) PCT Pub. No.: WO01/56123

PCT Pub. Date: Aug. 2, 2001

(65) Prior Publication Data

US 2003/0128921 A1 Jul. 10, 2003

(30) Foreign Application Priority Data

Jan. 26, 2000 (FR) .............................................. 00 01016

(51) Int. Cl.[7] .................................................. G02B 6/34
(52) U.S. Cl. .................................. 385/37; 19/24; 19/25
(58) Field of Search .................................. 385/1, 19, 24, 385/25, 31.37; 372/92, 101, 102

(56) References Cited

U.S. PATENT DOCUMENTS

| | | | | |
|---|---|---|---|---|
| 5,256,851 A | * | 10/1993 | Presby | 219/121.69 |
| 5,859,945 A | | 1/1999 | Kato et al. | 385/89 |
| 6,014,483 A | * | 1/2000 | Thual et al. | 385/33 |
| 6,061,369 A | * | 5/2000 | Conradi | 372/6 |
| 6,330,388 B1 | * | 12/2001 | Bendett et al. | 385/132 |
| 6,434,294 B1 | * | 8/2002 | Gallo | 385/27 |
| 6,525,872 B1 | * | 2/2003 | Ziari et al. | 359/341.3 |

FOREIGN PATENT DOCUMENTS

| | | | |
|---|---|---|---|
| EP | 0 825 464 A1 | 8/1997 | |
| EP | 0 798 830 A1 | 10/1997 | H01S/3/098 |
| EP | 0 927 894 A1 | 12/1998 | |
| EP | 0 930 679 A1 | 7/1999 | H01S/3/1055 |

OTHER PUBLICATIONS

Shinji Nagaoka, "Compact Latching–Type Single–Mode–Fiber Switches Fabricated by a Fiber–Micromachining Technique and Their Practical Applications", IEEE Journal of Selected Topics in Quantum Electronics, vol. 5, No. 1, Jan./Feb. 1999, pp. 36–45.

A.F.J. Levi, "Meso–optoelectronic devices and applications", Proceedings of Integrated Photonics Research Conference, Victoria, British Columbia, Canada, Mar. 30–Apr. 3, 1998, pp. 218–220.

Chanclou P. et al: "Highly Efficient Collective Coupling Between Laser Diode Array and Lensed Fibre Ribbon" Electronics Letters, GB, IEEE Stevenage, vol. 34, No. 3, Feb. 5, 1998, pp. 273–274.

Laurent A. et al: "Double external cavity laser diode for DWDM application" Journal Of Optics A: Pure and Applied Optics, Jan. 2000, IOP Publishing, UK, vol. 2, No. 1, pp. 1.6–1.8, Xp002150952 ISSN:1464–4258.

* cited by examiner

Primary Examiner—Juliana Kang
(74) Attorney, Agent, or Firm—Cohen, Pontani, Lieberman & Pavane

(57) ABSTRACT

A method and apparatus for wavelength switching a laser source. An external cavity (2) having a Bragg grating (5) is provided in an optical fiber (4). Space division switching is performed in the external cavity between a plurality of optical fibers (4) each having a different Bragg grating (5). A space division switch (3) is provided in the external cavity for switching between a plurality of optical fibers (4) each carrying a different Bragg grating (5).

19 Claims, 3 Drawing Sheets

METHOD AND APPARATUS FOR WAVELENGTH SWITCHING OF A LASER SOURCE

PRIORITY CLAIM

This application is a U.S. National Phase application under 35 USC 371 of International Application No. PCT/FR01/00196 filed on 19 Jan. 2001.

BACKGROUND OF THE INVENTION

The present invention relates to a method and to apparatus for wavelength switching a laser source.

The invention relates to the field of wavelength division multiplexing (WDM) that makes it possible to increase the capacity of optical fiber transmission infrastructure.

DISCUSSION OF THE PRIOR ART

A most advantageous application of the invention lies in that it makes it possible, by replacing the end laser source, to simplify maintenance of an existing optical fiber infrastructure when transmission over the optical fiber uses wavelength division multiplexing techniques that require laser sources providing multiple wavelengths. Such multiplexing techniques include techniques known as dense wavelength division multiplexing (DWDM) that are currently being deployed on transatlantic links that convey high data rates, part of which can be associated with using the Internet. Given the greatly increasing demand for use of the Internet, simplifying remotely-performed maintenance of the optical infrastructure merely by replacing the end laser source constitutes a major advantage.

At present, end laser sources compatible with multiple wavelength delivery can be of various types.

A first type is known as a distributed feedback (DFB) or a distributed Bragg reflector (DBR) laser. Such a source selects its wavelength by means of a selector element situated in the same structure as the amplifying medium.

A second type comprises external cavity laser sources defined by a Bragg grating photoinscribed in an optical fiber. European patent application 0 930 679 describes such a laser source which has an amplifying medium and some number of Bragg gratings photoinscribed in the same optical fiber; each of the Bragg gratings co-operates with the amplifying medium to determine an external cavity and a wavelength. Within the laser source, wavelength switching is performed by using a selected filter inserted between the amplifying medium and the optical fiber to select one of the wavelengths selected from the wavelengths present in the cavities.

In DFB or DBR laser sources, temperature dependency is of the order of 100 picometers per Kelvin (pm/K). Consequently, the use of DFB or DBR sources is a constraint since they must be temperature regulated by means of a Peltier element in order to ensure frequency stability. In contrast, with external cavity laser sources having the grating photoinscribed in silica, the Bragg wavelength has the advantage of being relatively insensitive to temperature, vary by about 15 pm/K.

Nevertheless, in a conventional external cavity source, the wavelengths all exist simultaneously in a single optical fiber in the absence of the filter, and consequently the filter must be accurately tuned to the wavelength to be selected. Consequently, it is necessary to control its temperature in order to maintain tuning because of the way the filter drifts with temperature.

SUMMARY OF THE INVENTION

Thus, the technical problem to be resolved by the present invention is to propose a method of switching the wavelength of a laser source having an external cavity with a Bragg grating in an optical fiber, in which wavelength switching is less sensitive to temperature, i.e. without using a temperature-sensitive element for wavelength tuning.

In the present invention, a solution to the technical problem posed consists in that said method consists in:
  performing space division switching in the external cavity between a plurality of optical fibers each having a different Bragg grating.

In addition, the invention provides wavelength switching apparatus for a laser source comprising an external cavity having a Bragg grating in an optical fiber. Said apparatus comprises:
  a space division switch in the external cavity for switching between a plurality of optical fibers each carrying a different Bragg grating.

Thus, the method of the invention relates to a laser source having an external cavity constituted firstly by an amplifying medium and secondly by a Bragg grating, and it switches wavelength by changing the external cavity by substituting one Bragg grating for another Bragg grating, the substitute Bragg grating having a pitch that is different from that of the preceding Bragg grating. Substitution is performed by space division switching in the external cavity between optical fibers each containing a Bragg grating.

The method and the apparatus for wavelength switching a laser source in accordance with the invention solves the problem posed. After space division switching has been performed, there is no need to use a filter to ensure that a single wavelength is present at a time at the outlet from the optical fiber facing the amplifying medium; a wavelength tunable element is not required. Consequently, wavelength switching can be performed without controlling temperature and, advantageously, the difference between the wavelengths is not limited by the selectivity of a filter.

In addition, the method and the apparatus of the invention make it possible to obtain single- or multi-channel laser emission depending on whether the laser has one amplifying medium or a plurality of amplifying media.

Furthermore, coupling between the optical fibers and the amplifying medium can be adapted as a function of special requirements. To keep the space division switch apart from the amplifying medium, the amplifying medium can be coupled to the optical fibers by means of an intermediate mono-mode optical fiber. The intermediate optical fiber can be fitted with a lens to optimize emission characteristics and to improve coupling. In addition, in order to limit disturbances during operation, the facing ends of the optical fibers can be fitted with coupling means such as a micro-optical system.

BRIEF DESCRIPTION OF THE DRAWINGS

Other characteristics and advantages of the invention appear from the following description made with reference to the accompanying figures given as non-limiting examples.

DETAILED DESCRIPTION OF THE DRAWINGS

Figure 1:
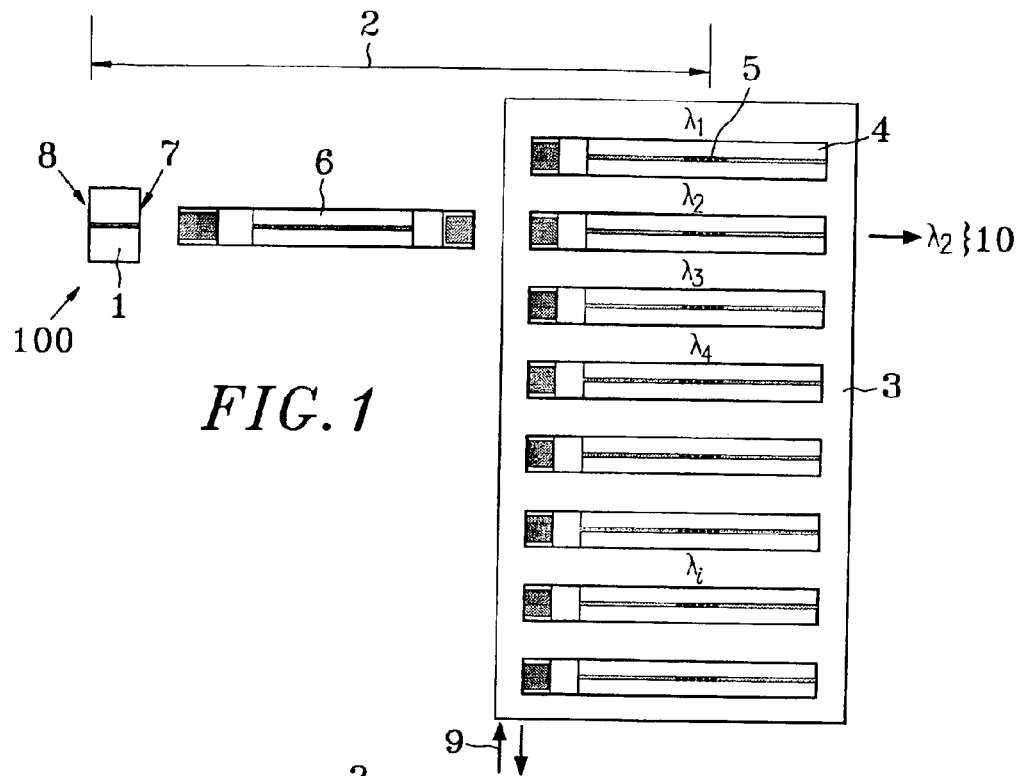
FIG. 1 is a diagram of a particular embodiment of single-channel switching apparatus of the invention.

FIG. 1 is a diagram of a particular embodiment of apparatus of the invention for switching a laser source 100. The apparatus comprises an amplifying medium 1, an external cavity, a space division switch 3, and optical fibers 4 carrying respective Bragg gratings 5. A special feature of this embodiment is that the apparatus also comprises an intermediate optical fiber 6.

In conventional manner, the amplifying medium 1 comprises a laser diode between two faces. One of these faces is referred to as the "front" face 7 and is treated to have reduced reflectivity. The treatment can consist in depositing dielectric layers. The treated face 7 is situated facing the Bragg gratings 5. The other face, known as the "rear" face 8 is not treated or is treated to be reflective like a mirror.

The external cavity 2 is defined by the rear face 8 and by one of the Bragg gratings 5.

The space division switch 3 makes it possible to bring each of the plurality of optical fibers 4 into register with the amplifying medium 1 in the external cavity 2. An example of such space division switching consists in moving the optical fibers 4 in translation past the amplifying medium 1 so as to position one of the optical fibers 4 to look into the amplifying medium 1. Translation is performed in opposite first and second directions marked by arrows 9. The space division switch 1 can make use of a thermal actuator, electromagnetic attraction, or any other known space division switching means.

Each optical fiber 4 installed on the space division switch 3 is a mono-mode fiber in which a Bragg grating 5 has been photoinscribed.

Each Bragg grating 5 has a given pitch which defines a wavelength. The number of different-pitch Bragg gratings 5 determines the number of different wavelengths that can be switched.

In this particular embodiment of the invention, an intermediate optical fiber 6 is disposed between the amplifying medium 1 and the space division switch 3 to provide coupling between the amplifying medium 1 and the space division switch 3. The intermediate optical fiber 6 facilitates positioning the space division switch 3 in register with the amplifying medium 1 and it enables the switch 3 to be disposed at a distance from the amplifying medium 1. The intermediate optical fiber 6 is a mono-mode fiber, it can be fitted with a lens to optimize emission characteristics and to improve coupling, and in addition the lens can have a hyperbolic profile. In particular, associating a hyperbolic profile with a graded index lens in the manner described in patent FR 2 752 623 granted in the name of the Applicant and described below makes it possible to have the intermediate optical fiber 6 at a considerable distance from the amplifying medium 1, e.g. 60 micrometers ($\mu$m).

As shown, the switch 3 is positioned in such a manner that the Bragg grating 5 corresponding to wavelength $\lambda_2$ defines the external cavity. In this configuration, the emission 10 output by the apparatus has a wavelength $\lambda_2$.

Figure 2:
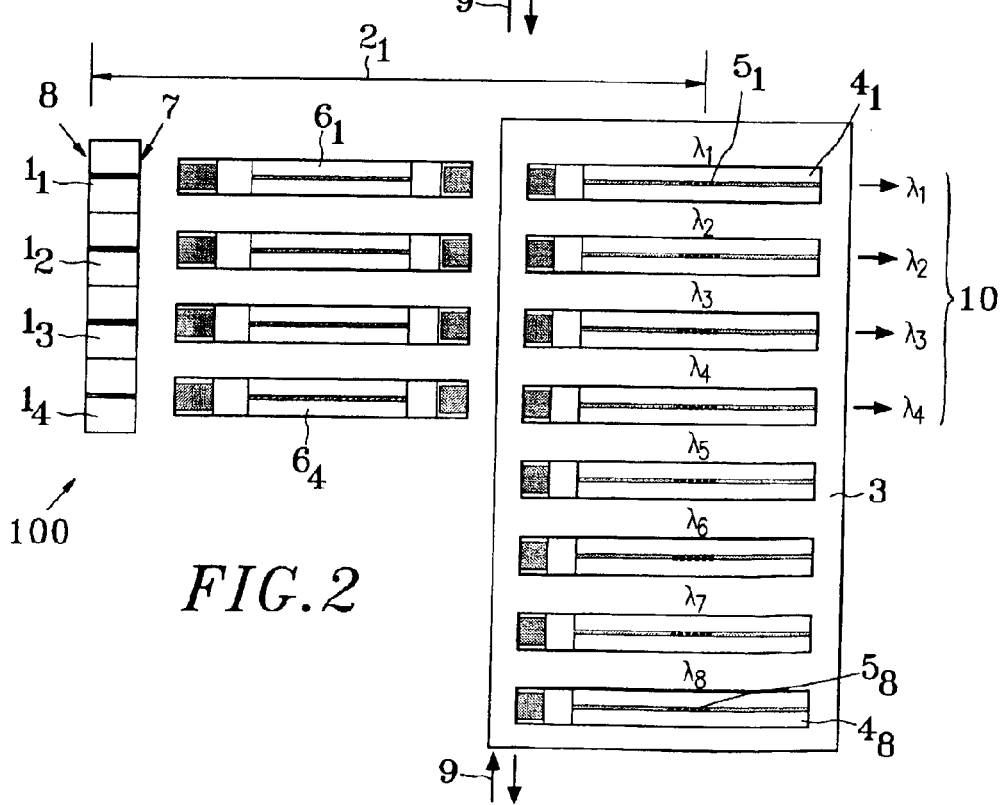
FIG. 2 is a diagram of a particular embodiment of multi-channel switching apparatus of the invention.

The apparatus shown in FIG. 1 is single-channel apparatus since the laser source 100 has only one amplifying medium 1, and only one external cavity 2. Consequently, the apparatus emits a single laser beam at one given wavelength. FIG. 2 shows a particular embodiment of multi-channel switch apparatus. Multi-channel apparatus enables a plurality of laser beams to be emitted simultaneously at different wavelengths. Providing the number of optical fibers is greater than or equal to the number of amplifying media, the number of beams emitted is determined by the number of amplifying media in the laser source 100. Together with a Bragg grating 5, each amplifying medium 1 constitutes an external cavity 2. In the example shown in FIG. 2, the laser source 100 has four amplifying media $1_i$ for i=1 to 4, and eight optical fibers $4_i$ for i=1 to 8. The number of output laser beams 10 is equal to the number of amplifying media, i.e. four. Each optical fiber $4_i$ comprises a Bragg grating $5_i$ which defines a wavelength $\lambda_i$ for i=1 to 8. In the example, the wavelengths associated with the Bragg gratings are $\lambda_1$, $\lambda_2$, $\lambda_3$, $\lambda_4$, $\lambda_5$, $\lambda_6$, $\lambda_7$, and $\lambda_8$ and the switch 3 is positioned in such a manner that the output laser beams have emission wavelengths of $\lambda_1$, $\lambda_2$, $\lambda_3$, and $\lambda_4$. Switching the optical fibers $4_i$ makes it possible to change the output wavelengths. For example, by switching the set of optical fibers $4_i$ four times, the output laser beams will have respective emission wavelengths of $\lambda_5$, $\lambda_6$, $\lambda_7$, and $\lambda_8$.

The embodiment is particular in that the apparatus also has respective intermediate optical fibers $6_i$ between the amplifying media and the optical fibers; each intermediate optical fiber performs the same function as the intermediate optical fiber in the preceding apparatus.

The apparatus described with reference to FIGS. 1 and 2 correspond to apparatus in a transmission configuration, i.e. the outputs 10 of the apparatus are on the optical fiber side of the amplifying medium 1. In other words, the outputs 10 from the apparatus are on the same side as the front face 7 of the amplifying media 1.

Figure 3:
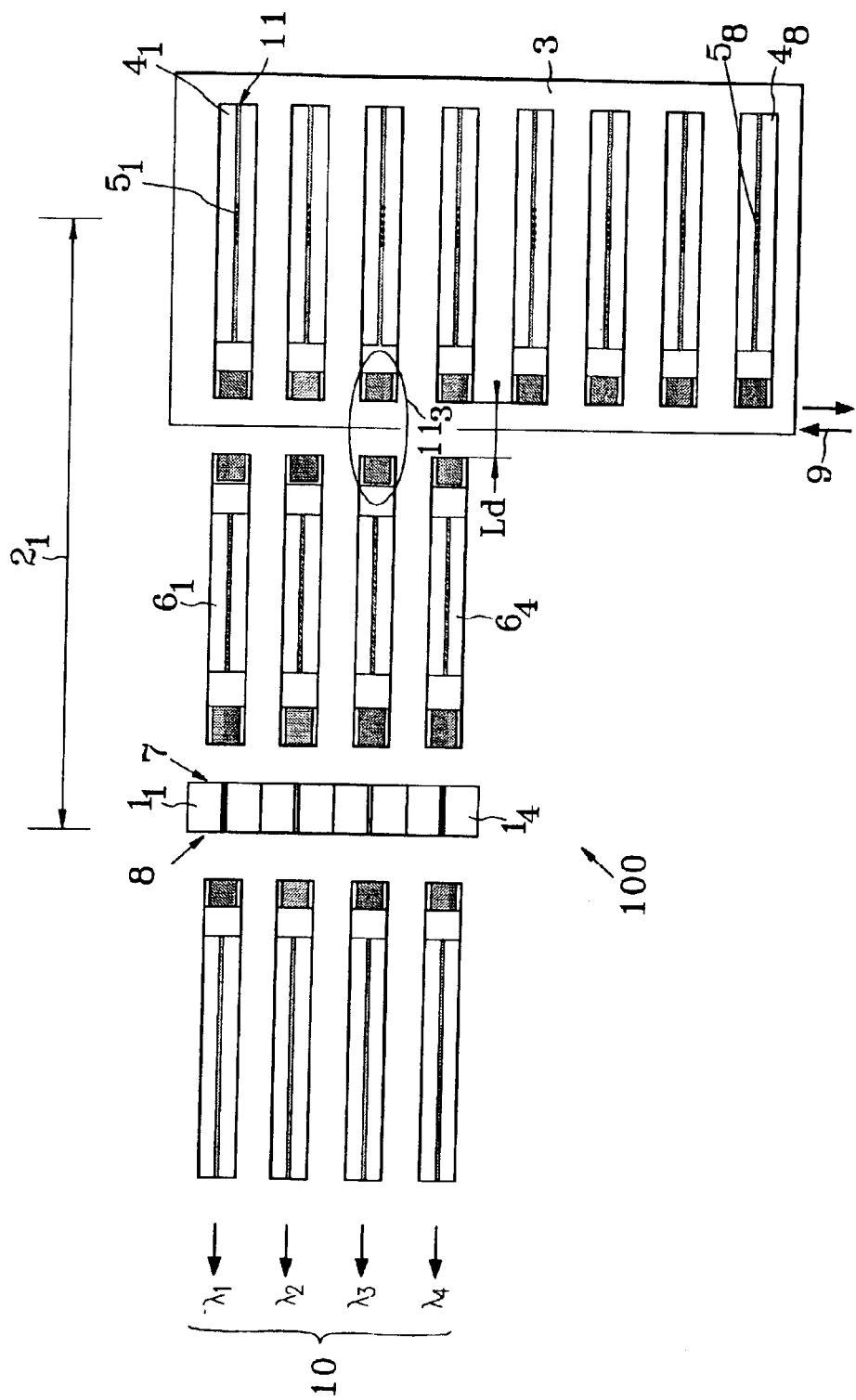
FIG. 3 is a diagram of a particular embodiment of multi-channel switching apparatus of the invention in a reflection configuration.

FIG. 3 is a diagram of switching apparatus of the invention in a reflection configuration. In this configuration, the outputs 10 from the apparatus are on the sides of the amplifying media $1_i$ that are remote from the optical fibers $4_i$. In other words, the outputs 10 of the apparatus are on the same side as the rear face 8 of each amplifying medium $1_i$. In this configuration, the reflectivity of the output optical surfaces 11 of the optical fibers $4_i$ having respective Bragg gratings $5_i$ can be limited by special treatment. This treatment can consist in cleaving the optical fiber and in polishing the optical fiber at a bias of 12° for example, or in inserting an index-matching gel. Such treatments are known to the person skilled in the art.

The performance of an external cavity laser source is closely tied to the ratio of the threshold gains respectively of the laser diode and of the external cavity. Unfortunately, the parasitic cavity formed between the ends of the optical fibers disturbs the external cavity since it is inserted between the front face of the amplifying medium and the Bragg grating. A high level of feedback on these optical fiber ends contributes to increasing the threshold gain of the external cavity and thus to enhancing laser oscillation at the laser diode. This competition between diode laser mode and external cavity mode can give rise to a sudden increase in the noise of the laser source if the threshold gains become close. It can also greatly reduce the lateral mode suppression ratio.

Depending on its coupling losses, its length, the shape of the optical surfaces of the media involved, and the indices of the media involved, the parasitic cavity can disturb laser emission. In particular, this can give rise to an increase in relative intensity noise (RIN), and to a decrease in the lateral mode suppression ratio. Thus, coupling is determined so as to enlarge mode size and/or lengthen the parasitic cavity. Furthermore, the greater mode size, the slacker the constraints on alignment between two optical fibers. In addition, lengthening the parasitic cavity makes it possible to minimize the optical feedback which disturbs the operation of an external cavity laser source. Various embodiments of couplings for implementing the invention are described below with reference to FIGS. 4 to 7.

Figure 4:
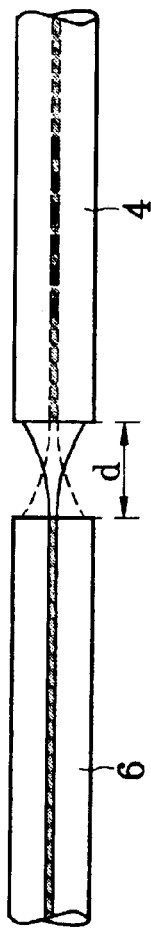
FIGS. 4 to 7 are diagrams of particular modes of coupling between optical fibers.

In a first embodiment, coupling between optical fibers is performed by cleaving the optical fibers. FIG. 4 shows coupling of this type in which two mono-mode optical fibers 4 and 6 are cleaved at right angles. The distance d between the two optical fibers determines the length of the parasitic cavity. This length is about 20 μm. This embodiment has the advantage of being simple to make.

Figure 5:
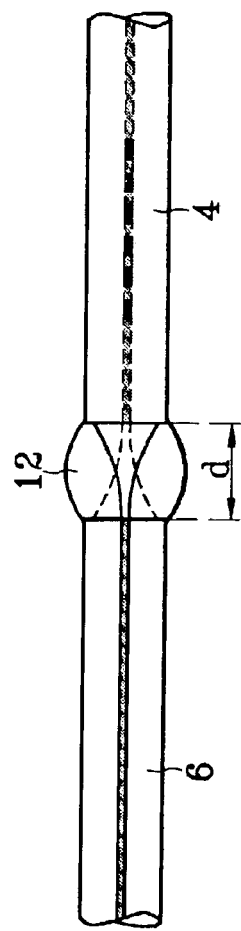

The coupling performance of this embodiment can be improved in a variant embodiment. This is shown in FIG. 5. The improvement is obtained by inserting an index-matching liquid 12 between the two optical fibers 6 and 4. The index-matching liquid 12 serves to limit the influence of the parasitic cavity of length d. This variant thus makes it possible to relax transverse positioning tolerances and to improve coupling performance.

Figure 6:
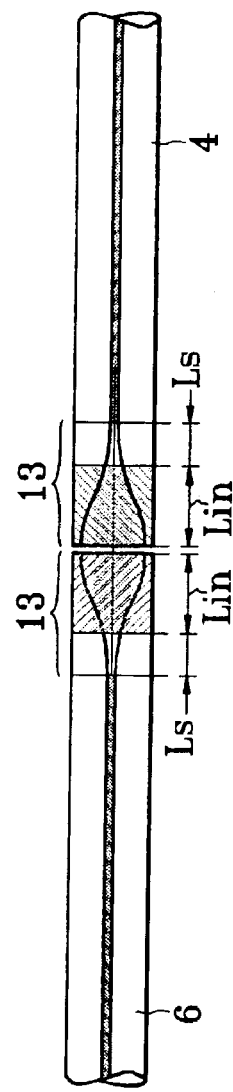
Figure 7:
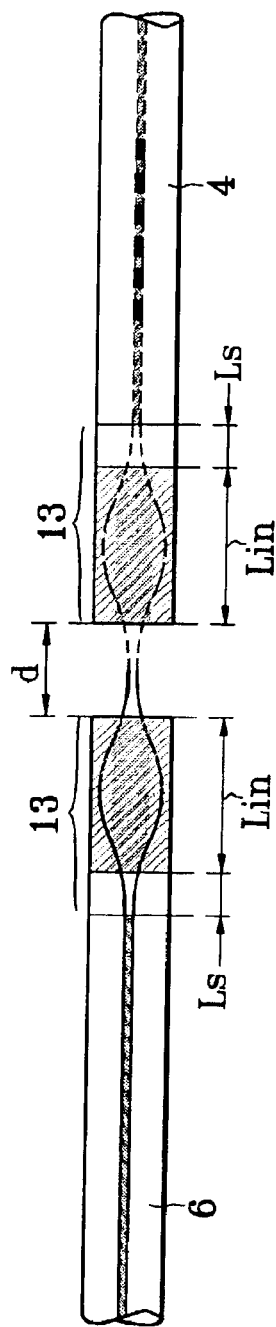

In a second embodiment shown in FIGS. 6 and 7, coupling between the optical fibers 6 and 4 is performed by means of fibers fitted with micro-optical systems 13 known by the term "gradissimo". The purposes of this micro-optical systems 13 is to adapt mode size at the ends of the optical fibers so as to comply with the looked-for coupling characteristics. They rely on placing both a first segment of pure silica fiber of length Ls and a second segment of graded-index fiber of length Lin at the end of a mono-mode optical fiber. These micro-optical systems 13 do not require an index-matching gel to be used, but they can nevertheless be combined with gel insertion depending on the criteria laid down (cost, performance, . . . ). A "gradissimo" micro-optical system is obtained by a method which consists:

in using a collective welding head to weld a ribbon of n multi-mode graded index optical fibers, abbreviated "gradis", to a ribbon of n core-less silica optical fibers, abridged "si";

in breaking the ribbon of n core-less silica optical fibers so as to obtain n parallel segments of length l;

in welding a ribbon of n mono-mode optical fibers, abridged "mo" to the silica segments; and in breaking the ribbon so as to retain a length L of graded index multi-mode optical fiber in line with the silica segments.

The resulting ribbon has n micro-optical systems where n is greater than or equal to 1. The ribbon is referred to by the term "gradissimo" which is a combination of the abbreviations for graded index (gradis), silica (si), and mono-mode (mo). The method is described in greater detail in French patent No. 2 752 623 granted in the name of the Applicant.

Coupling by means of micro-optical systems makes it possible with determined lengths Ls and Lin to increase the mode size as shown in FIG. 6. Thus, by way of example, it is possible to obtain a mode size of 58 μm at the end of the optical fiber which is to be compared with the mode size of 9.2 μm at the end of a conventional mono-mode optical fiber. This difference makes it possible significantly to relax positioning tolerances in a way that is not possible when coupling using a conventional mono-mode optical fiber. In the example, the theoretical transversal alignment that corresponds to a coupling loss of 3 dB goes from 7.5 μm for coupling with conventional mono-mode optical fibers to 24 μm for coupling with micro-optical systems.

Lengthening the parasitic cavity is not effective with simple mono-mode optical fibers. With such coupling, lengthening leads to a drop in the coupling ratio and to an unacceptable increase in the threshold gain of the external cavity laser source. Coupling by means of micro-optical systems 13 makes it possible to increase the length d of the parasitic cavity as shown in FIG. 7. Such coupling thus makes it possible to optimize emission characteristics. That is to say it makes it possible to obtain a better mode suppression ratio and greater stability faced with variations in bias current compared with coupling by means of a right-cleaved mono-mode optical fiber. At equivalent current (50 milliamps (mA)), coupling by means of micro-optical systems gives performance similar to that obtained with coupling by means of mono-mode optical fibers immersed in index-matching liquid. However coupling by means of micro-optical systems is particularly advantageous in that it does not require any index-matching liquid.

What is claimed is:

1. Apparatus for wavelength switching a laser source comprising:

a space division switch including a plurality of optical fibers, each having a different Bragg grating;

an external cavity coupleable with one optical fiber of said plurality of optical fibers, said space division switch being switchable for coupling a currently selected one of the plurality of optical fibers with said external cavity, said external cavity producing a different output wavelength with each of the plurality of optical fibers;

an amplifying medium having a front face and a rear face, the rear face co-operating with the Bragg grating of the currently selected one of the plurality of optical fibers to define the external cavity; and an intermediate optical fiber between the front face of the amplifying medium and said space division switch to couple the amplifying medium to the currently selected one of the plurality of optical fibers carrying the Bragg grating.

2. Apparatus for wavelength switching a laser source according to claim 1, further comprising a plurality of amplifying media defining a plurality of external cavities coupled with respective ones of said plurality of optical fibers to emit laser beams simultaneously from said respective ones of said plurality of optical fibers; and a plurality of intermediate optical fibers, each intermediate optical fiber coupling an amplifying medium to respective ones of the plurality of optical fibers.

3. Apparatus for wavelength switching a laser source according to claim 2, wherein ends of each optical fiber carrying a Bragg grating, with said ends facing away from the intermediate optical fiber, are treated to limit the reflectivity of at least one of the ends of each of said plurality of optical fibers; and the laser beams are emitted from the rear faces of the amplifying medium.

4. Apparatus for wavelength switching a laser source according to claim 2, wherein said intermediate optical fiber and each of the plurality of optical fibers carrying a Bragg grating is cleaved.

5. Apparatus for wavelength switching a laser source according to claim 2, wherein facing ends of said intermediate optical fiber and of each of said plurality of optical fibers carrying a Bragg grating are fitted with respective micro-optical systems each comprising a segment of pure silica and a graded index segment, said segments being of determined lengths (Ls, Lin) to couple the intermediate optical fiber together with one of said plurality of optical fibers.

6. Apparatus for wavelength switching a laser source according to claim 2, wherein one of the ends of said intermediate optical fiber is fitted with a segment of pure silica and with a graded index segment, said segments being of determined lengths, to couple said intermediate optical fiber to the amplifying medium.

7. Apparatus for wavelength switching a laser source according to claim 1, wherein ends of each optical fiber carrying a Bragg grating, with said ends facing away from the intermediate optical fiber, are treated to limit the reflectivity of at least one of the ends of each of said plurality of optical fibers; and the laser beams are emitted from the rear faces of the amplifying medium.

8. Apparatus for wavelength switching a laser source according to claim 7, wherein said intermediate optical fiber and each of the plurality of optical fibers carrying a Bragg grating is cleaved.

9. Apparatus for wavelength switching a laser source according to claim 7, wherein facing ends of said intermediate optical fiber and of each of said plurality of optical fibers carrying a Bragg grating are fitted with respective micro-optical systems each comprising a segment of pure silica and a graded index segment, said segments being of determined lengths (Ls, Lin) to couple the intermediate optical fiber together with one of said plurality of optical fibers.

10. Apparatus for wavelength switching a laser source according to claim 7, wherein one of the ends of said intermediate optical fiber is fitted with a segment of pure silica and with a graded index segment, said segments being of determined lengths, to couple said intermediate optical fiber to the amplifying medium.

11. Apparatus for wavelength switching a laser source according to claim 1, wherein said intermediate optical fiber and each of the plurality of optical fibers carrying a Bragg grating is cleaved.

12. Apparatus for wavelength switching a laser source according to claim 11, further comprising an index-matching liquid between said intermediate optical fiber and the currently selected one of the plurality of optical fibers carrying a Bragg grating.

13. Apparatus for wavelength switching a laser source according to claim 12, wherein one of the ends of said intermediate optical fiber is fitted with a segment of pure silica and with a graded index segment, said segments being of determined lengths, to couple said intermediate optical fiber to the amplifying medium.

14. Apparatus for wavelength switching a laser source according to claim 11, wherein one of the ends of said intermediate optical fiber is fitted with a segment of pure silica and with a graded index segment, said segments being of determined lengths, to couple said intermediate optical fiber to the amplifying medium.

15. Apparatus for wavelength switching a laser source according to claim 1, wherein facing ends of said intermediate optical fiber and of each of said plurality of optical fibers carrying a Bragg grating are fitted with respective micro-optical systems each comprising a segment of pure silica and a graded index segment, said segments being of determined lengths (Ls, Lin) to couple the intermediate optical fiber together with one of said plurality of optical fibers.

16. Apparatus for wavelength switching a laser source according to claim 15, further comprising an index-matching liquid between said intermediate optical fiber and the currently selected one of the plurality of optical fibers carrying a Bragg grating.

17. Apparatus for wavelength switching a laser source according to claim 15, wherein one of the ends of said intermediate optical fiber is fitted with a segment of pure silica and with a graded index segment, said segments being of determined lengths, to couple said intermediate optical fiber to the amplifying medium.

18. Apparatus for wavelength switching a laser source according to claim 1, wherein one of the ends of said intermediate optical fiber is fitted with a segment of pure silica and with a graded index segment, said segments being of determined lengths, to couple said intermediate optical fiber to the amplifying medium.

19. Apparatus for wavelength switching a laser source according to claim 18, wherein an end of the intermediate optical fiber facing the amplifying medium includes a hyperbolic profile.

* * * * *